US006927662B2

(12) United States Patent
Kahlmann et al.

(10) Patent No.: US 6,927,662 B2
(45) Date of Patent: Aug. 9, 2005

(54) INTEGRATED TRANSFORMER CONFIGURATION

(75) Inventors: Frank Kahlmann, Neubiberg (DE); Bernhard Strzalkowski, München (DE); Wolfgang Werner, München (DE)

(73) Assignee: Infineon Technologies AG, Munich (DE)

(*) Notice: Subject to any disclaimer, the term of this patent is extended or adjusted under 35 U.S.C. 154(b) by 40 days.

(21) Appl. No.: 10/622,934

(22) Filed: Jul. 18, 2003

(65) Prior Publication Data

US 2004/0056749 A1 Mar. 25, 2004

(30) Foreign Application Priority Data

Jul. 18, 2002 (DE) .......................... 102 32 642

(51) Int. Cl.[7] .................................................. H01F 5/00
(52) U.S. Cl. ..................... 336/200; 336/223; 336/232
(58) Field of Search ................................. 336/200, 223, 336/232; 29/602.01

(56) References Cited

U.S. PATENT DOCUMENTS

| 4,785,345 | A | | 11/1988 | Rawls et al. |
| 5,349,873 | A | * | 9/1994 | Omura et al. ............ 73/862.68 |
| 5,519,582 | A | * | 5/1996 | Matsuzaki .................. 361/783 |
| 5,852,866 | A | | 12/1998 | Kuettner et al. |
| 6,097,273 | A | * | 8/2000 | Frye et al. ................... 336/200 |
| 6,114,937 | A | | 9/2000 | Burghartz et al. |
| 2002/0013034 | A1 | | 1/2002 | Liou |
| 2003/0001709 | A1 | * | 1/2003 | Visser ........................ 336/200 |

FOREIGN PATENT DOCUMENTS

| DE | 196 40 676 A1 | 10/1997 |
| DE | 199 45 855 A1 | 3/2001 |
| DE | 101 00 282 A1 | 7/2002 |
| EP | 0 637 842 A1 | 2/1995 |
| GB | 2 173 956 A | 10/1986 |

* cited by examiner

Primary Examiner—Anh Mai
(74) Attorney, Agent, or Firm—Laurence A. Greenberg; Werner H. Stemer; Ralph E. Locher

(57) ABSTRACT

The present invention relates to an integrated transformer configuration having a first coil formed from an electrically conductive material having a spiral course with an essentially rectangular cross section. The transformer has a second coil with a spiral course. The first and the second coils are arranged such that they are electrically insulated from one another. The ratio between the height and the width of the rectangular cross section of the first coil is greater than 1.

27 Claims, 15 Drawing Sheets

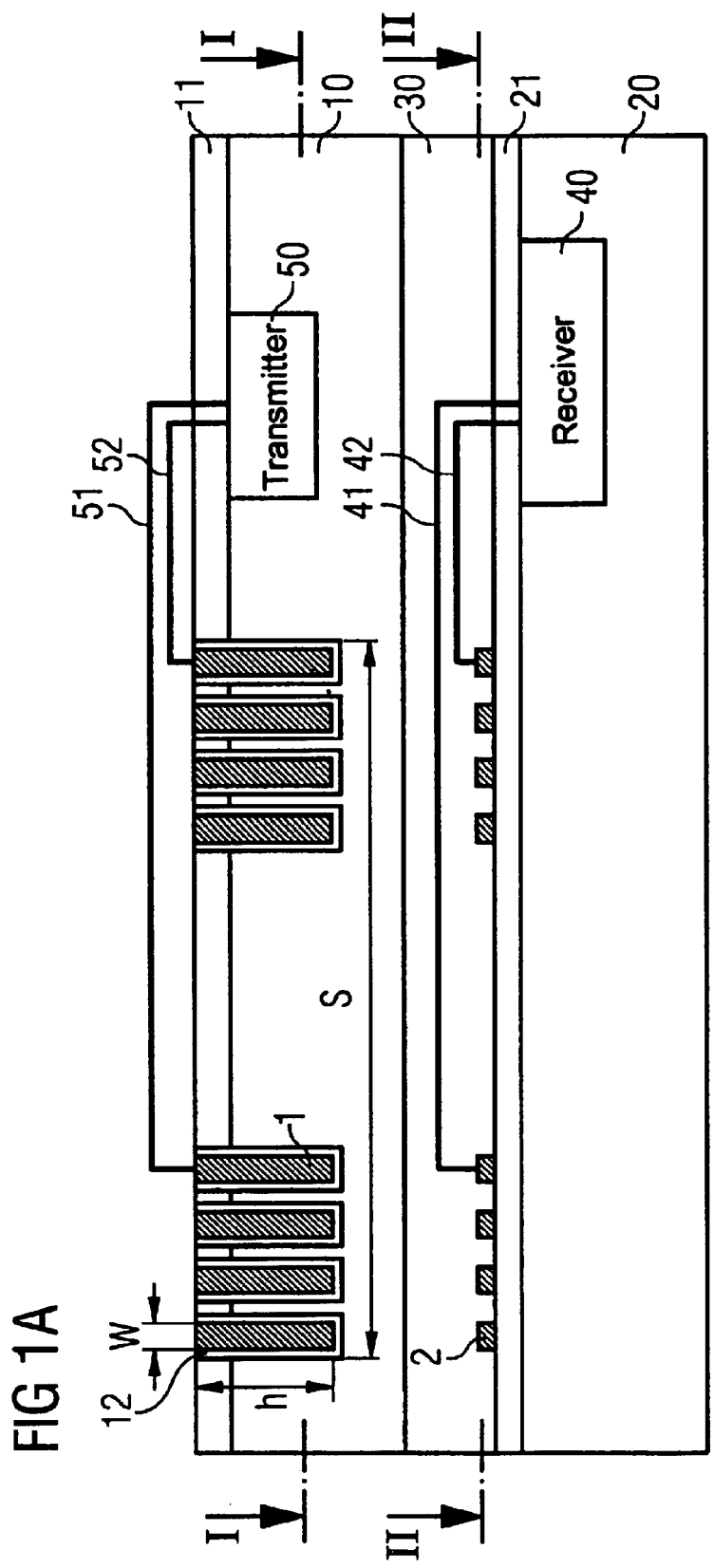

I-I, II-II

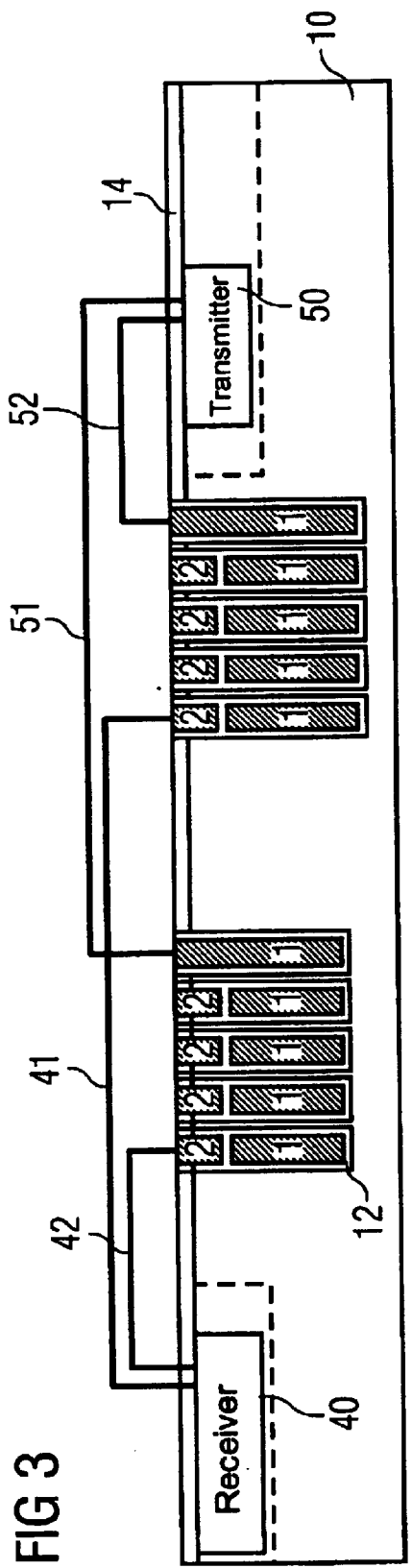

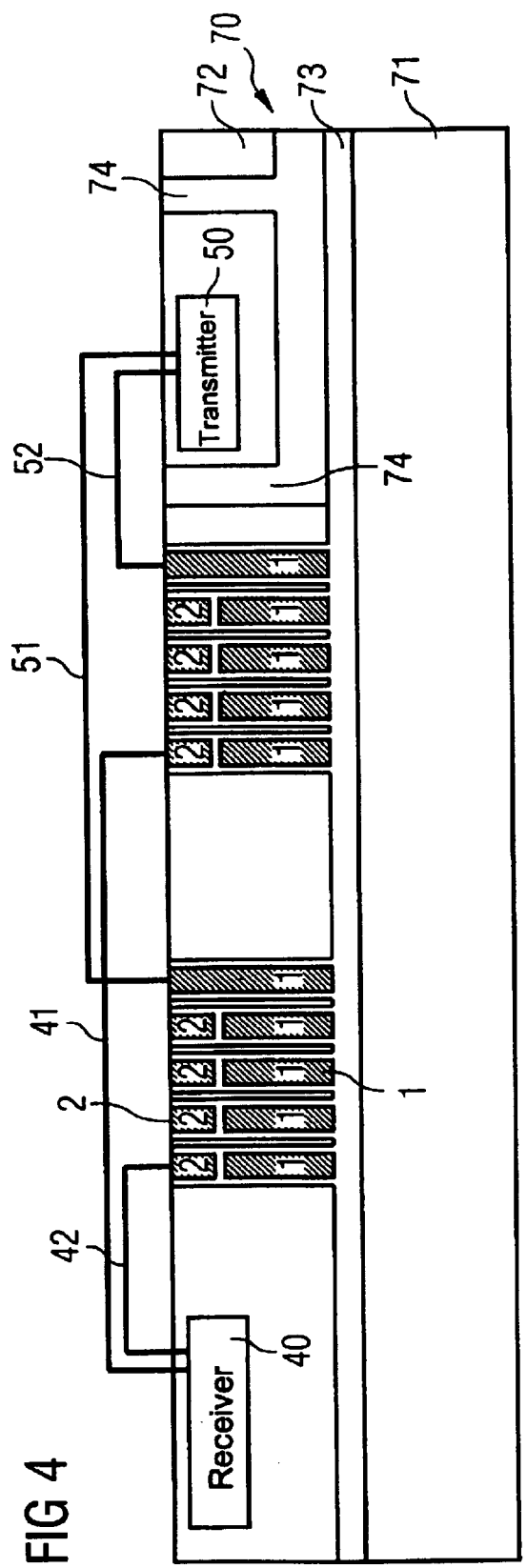

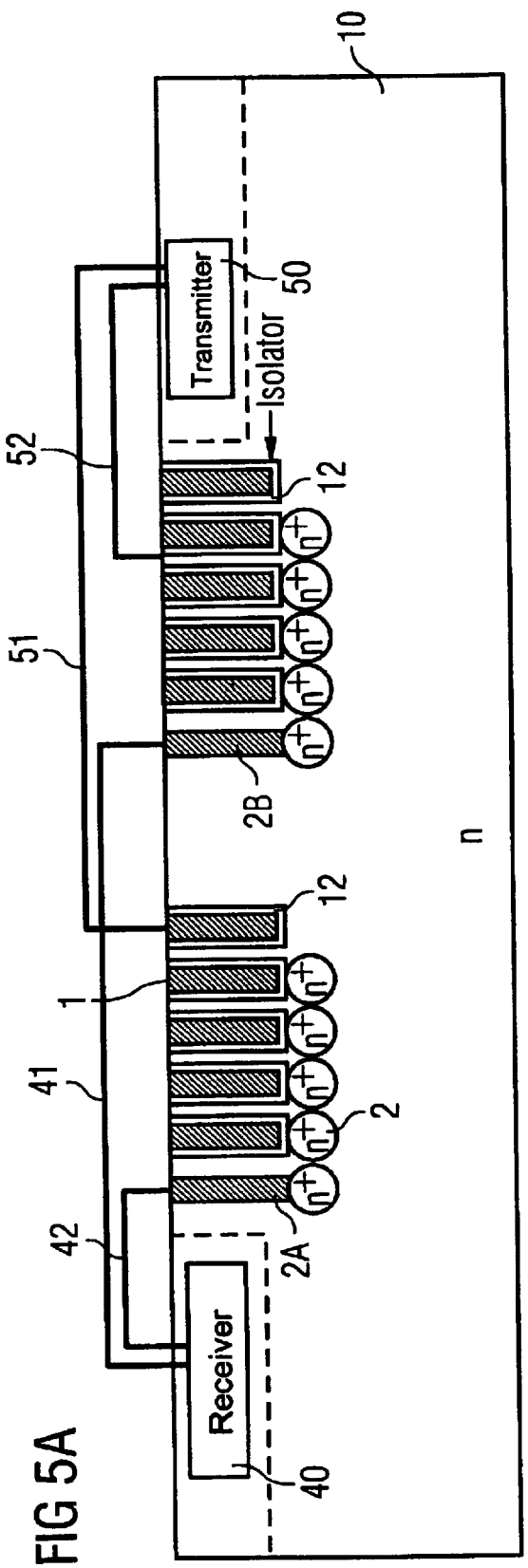

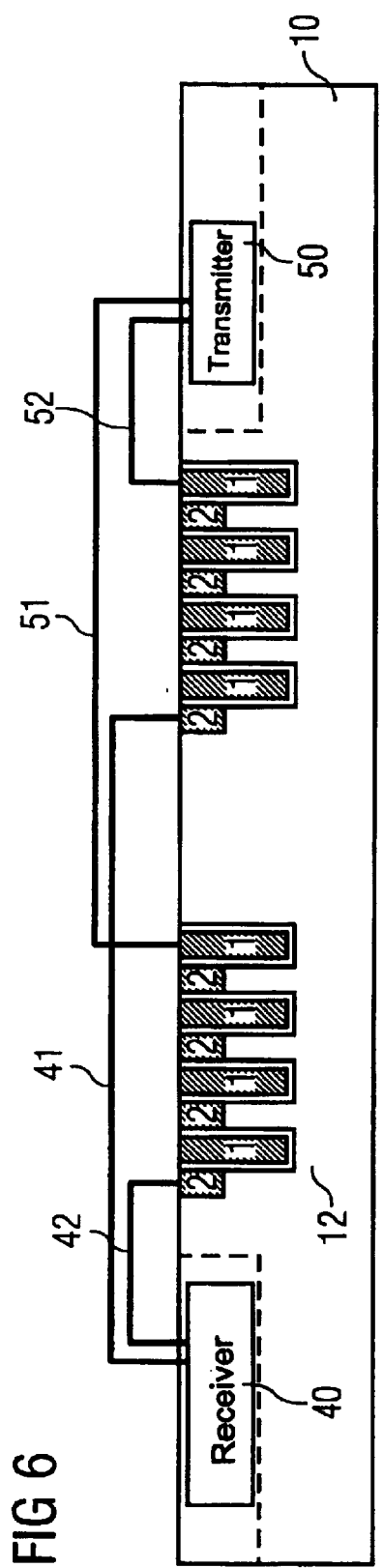

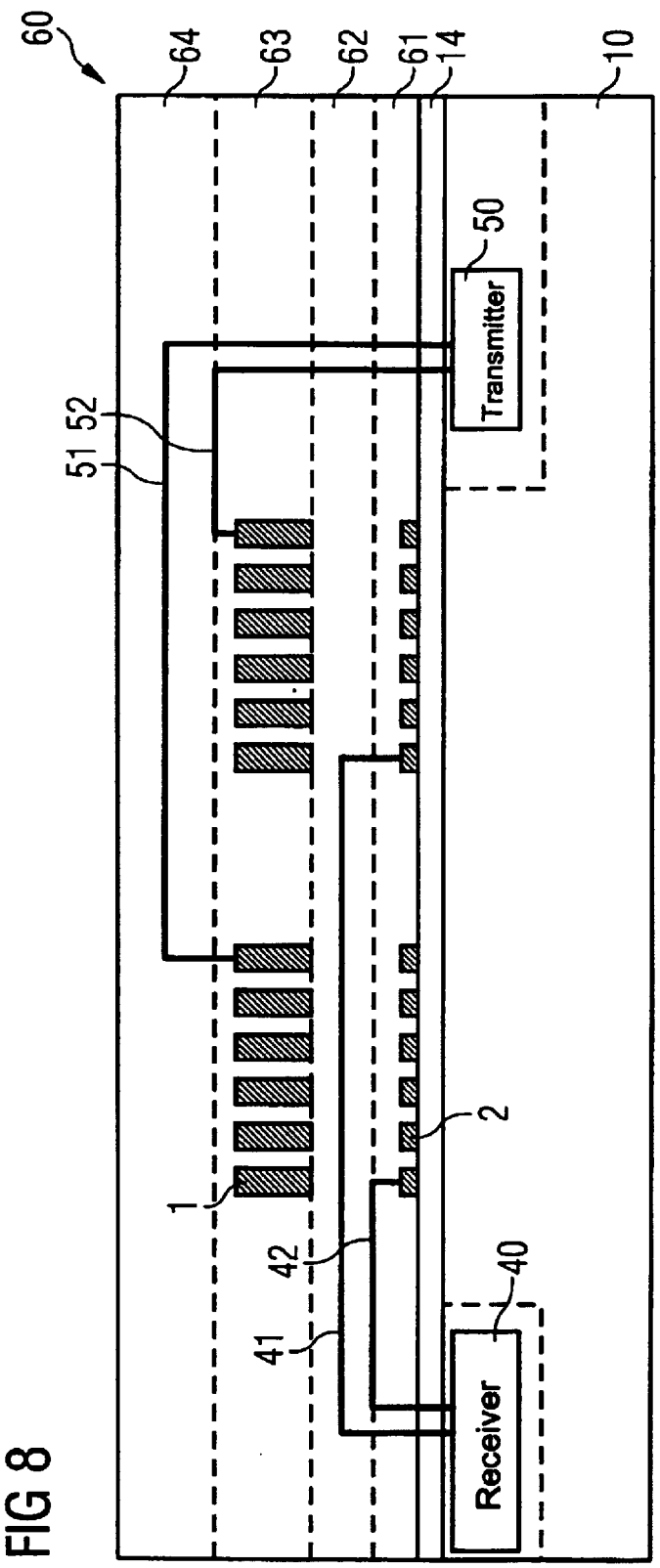

INTEGRATED TRANSFORMER CONFIGURATION

BACKGROUND OF THE INVENTION

Field of the Invention

The present invention relates to an integrated transformer having first and second coils that are electrically insulated from one another. The first and second coils have spiral courses and the first coil has a rectangular cross section.

A transformer configuration of this type is described for example in Published British Patent Application GB 2173956 and in Published German Patent Application DE 101 00 282.3.

Such planar transformer configurations are used in signal transmission if it is necessary to feed a signal generated by one circuit configuration to a further circuit configuration while electrically isolating the circuit generating the signal from the circuit that processes the signal further.

In this case, the two coils are arranged such that they are electrically insulated from one another and adjacent to one another, in order to ensure an inductive coupling of the two coils. Usually, a core is not used in planar integrated transformers, for which reason these transformers are also referred to as coreless transformers.

What is critical for the transmission properties of such a transformer is the time constant $\tau=L/R$ of the primary winding, which is given by the quotient of the inductance L and the winding resistance R. The transmission effectiveness improves as the time constant increases.

SUMMARY OF THE INVENTION

It is accordingly an object of the invention to provide an integrated transformer configuration with a high time constant for improving the transmission effectiveness.

With the foregoing and other objects in view there is provided, in accordance with the invention, an integrated transformer configuration. The integrated transformer configuration includes a first coil, which is formed from an electrically conductive material having a spiral course with an essentially rectangular cross section, and a second coil having a spiral course. The first and second coils are arranged such that they are electrically insulated from one another. The ratio between the height and the width of the rectangular cross section of the first coil is greater than 1 and is preferably greater than 3.

The ratio between the height and the width of the first coil, which is essentially rectangular in cross section, is also referred to as the aspect ratio.

As the aspect ratio increases, the cross section of the first coil is enlarged, so that the conduction resistance of the first coil decreases, which results in an increasing time constant in accordance with the above relationship, according to which the time constant is $\tau=L/R$. This increase in the time constant is not detrimental to the area requirement needed for the coil, since it is possible to maintain the width of the conductor material having a spiral course which forms the coil. By contrast, there is usually space present in the depth, in which the dimensions of the coil are enlarged, since the carrier material of the planar first and second coils should not fall below specific dimensions for stability reasons.

In one embodiment of the invention, the first coil is formed in a first trench in a first semiconductor body. The trench has a spiral course and extends into the semiconductor body in the vertical direction. There are various possibilities in this case for the configuration of the second coil.

One embodiment provides for the second coil to be formed in or on a second semiconductor body. The first and second semiconductor bodies are arranged one above the other such that they are insulated from one another. In this case, the second coil may be formed in an insulation layer between the first and second semiconductor bodies or in the second semiconductor body.

A further embodiment with regard to the configuration of the second coil provides for the second coil to be formed in an insulation layer above the first semiconductor body, in which case the insulation layer may be, in particular, part of a so-called wiring or metalization plane. Such a second coil can be fabricated using conventional method steps that are known in the fabrication of semiconductor components for realizing wirings above a semiconductor body.

Moreover, a further embodiment provides for the second coil to be formed above or below the first coil in a trench. The two coils are isolated from one another by an insulation layer in the trench.

The second coil may be composed of the same electrically conductive material as the first coil, in particular of copper or aluminum. The second coil may also be composed of a heavily doped, and hence readily electrically conductive, semiconductor material. This heavily doped material that forms the second coil is preferably formed below the trench with the first coil or in the interspaces of the trench having a spiral course with the first coil.

One embodiment of the invention provides for the first coil to be formed in an insulation layer above a semiconductor body, in which case the insulation layer may be part of a wiring or metalization plane of the semiconductor body. Transmitter and/or receiver circuits, for example, are integrated in the semiconductor body. In this configuration of the first coil, too, there are various configurational possibilities for the realization of the second coil.

One embodiment provides for the second coil also to be formed above the semiconductor body in the insulation layer in a manner insulated from the semiconductor body, preferably between the first coil and the semiconductor body.

A further embodiment provides for the second coil to be formed in the semiconductor body and preferably to be composed of a heavily doped semiconductor material.

A further embodiment with regard to the configuration of the first coil provides for forming a plurality of component coils arranged one above the other in the insulation layer. A part of the insulation layer may be arranged in each case between these component coils. The component coils are connected in parallel, that is to say they are electrically connected to one another at their respective terminals.

The semiconductor body in which or on which the first and second coils are arranged may be part of an SOI (Silicon On Insulator) substrate in which a semiconductor material, an insulation material and a substrate are present one above the other.

The transformer configuration preferably includes a transmitting device connected to one of the two coils, and a receiver device connected to the other of the two coils. These two devices may be integrated in a common semiconductor body, preferably a semiconductor body in which or on which at least one of the two coils is also formed, or in separate semiconductor bodies. The first coil having an aspect ratio of greater than 1 is preferably connected to the transmitting device.

In the case where the transmitter device and the receiver device are jointly realized in one semiconductor body, these two devices are electrically insulated from one another, which may be realized by an insulation material, particularly in the case of SOI substrates, or by pn junctions.

Other features which are considered as characteristic for the invention are set forth in the appended claims.

Although the invention is illustrated and described herein as embodied in an integrated transformer configuration, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1A is a cross sectional view of an exemplary embodiment of an integrated transformer having a first and a second coil which are integrated in different semiconductor bodies arranged one above the other;

FIG. 3 is a cross sectional view of an exemplary embodiment of an integrated transformer configuration in which the first and second coils are arranged one above the other in a trench of a semiconductor body;

FIG. 4 is a cross sectional view of a further exemplary embodiment of an integrated transformer configuration in which the first coil and the second coil are arranged such that they lie one above the other in a trench of a semiconductor body;

FIG. 5A is a cross sectional view of an exemplary embodiment of an integrated transformer configuration in which the second coil is formed by a heavily doped semiconductor region in a semiconductor body and is connected to a receiver by line connections running above the semiconductor body;

FIG. 6 is a cross sectional view of an exemplary embodiment of an integrated transformer configuration in which the second coil is formed from a heavily doped semiconductor region in interspaces of a trench containing the first coil in a semiconductor body;

FIG. 8 is a cross sectional view of an exemplary embodiment of an integrated transformer configuration in which the first and second coils are formed in an insulation layer above a semiconductor body;

DESCRIPTION OF THE PREFERRED EMBODIMENTS

In the figures, unless specified otherwise, identical reference symbols designate identical parts with the same meaning.

Figure 1B:
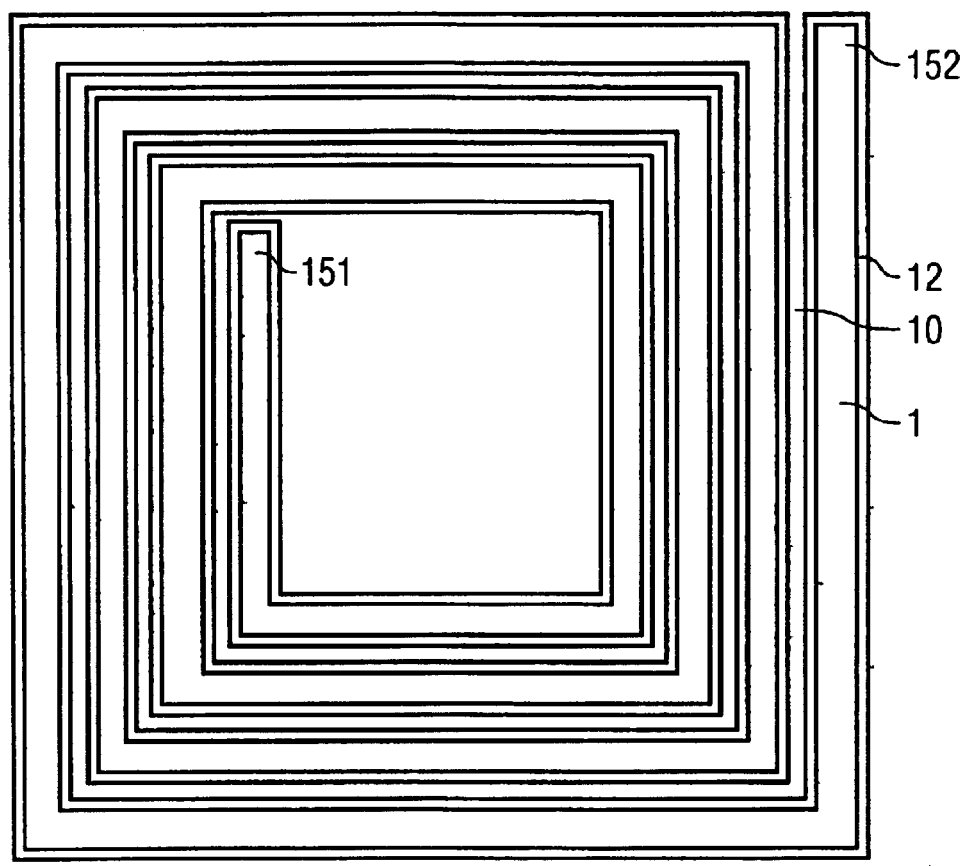
FIG. 1B is a plan view of the exemplary embodiment of the integrated transformer shown in FIG. 1A.

Referring now to the figures of the drawing in detail and first, particularly, to FIG. 1 thereof, there is shown a first exemplary embodiment of an integrated transformer configuration that has two planar coils 1, 2 inductively coupled to one another. FIG. 1a is a side cross sectional view of the transformer configuration. FIG. 1b shows a cross section of the transformer configuration in the sectional plane I—I depicted in FIG. 1a.

The transformer configuration in accordance with FIG. 1 has a first semiconductor body 10 and a second semiconductor body 20, which are arranged one above the other and are electrically insulated from one another by an insulation layer 30, for example, a polyimide or a semiconductor oxide. In this case, the first semiconductor body 10 is arranged above the second semiconductor body 20 and has a trench which, proceeding from one of the surfaces of the semiconductor body 10, extends into the semiconductor body in the vertical direction and has a spiral course in plan view (See FIG. 1b). The trench is filled with an electrically conductive material, for example, aluminum or copper. The electrically conductive material is electrically insulated from the semiconductor body 10 by an insulation layer 12. The insulation material of the insulation layer 12 preferably includes a semiconductor oxide.

The electrically conductive material, which has a spiral course in the trench, forms the first coil 1 of the transformer configuration. The ratio between a height h of this turn and a width W is greater than 1, and is preferably greater than 3. The height h of the turn is essentially determined by the depth of the trench in the vertical direction of the semiconductor body, and the width W of the turn is essentially determined by the width of the trench in the horizontal direction of the semiconductor body. It is possible to set these parameters in a sufficiently known manner in semiconductor processes. The trench is fabricated, for example, by depositing a resist mask onto the surface of the semiconductor body 10 and carrying out a subsequent etching method.

The first coil 1 is connected via line connections 51, 52, which are only illustrated diagrammatically in FIG. 1a, to a transmitting device 50 integrated in the semiconductor body 10. The transmitting device 50 makes contact with the ends 151, 152 of the coil 1, which are depicted in FIG. 1b, via the line connections 51, 52. The transmitting device integrated in the semiconductor body 10 is electrically insulated from the coil 1 by the insulation layer 12 surrounding the coil 1. Furthermore, an insulation layer 11 is applied at the surface of the semiconductor body 10. The insulation layer electrically insulates a wiring plane in which the line connections 51, 52 are accommodated. The wiring plane is not illustrated in any greater detail, from the integrated transmitting circuit 50.

The second coil 2 likewise has a spiral course in accordance with the first coil 1 and is formed in the insulation layer 30 between the second semiconductor body 20 and the first semiconductor body 10. The second coil 2 is formed above an insulation layer 21, which is formed on that surface of the second semiconductor body 20 which faces the first semiconductor body 10. A receiver device 40 formed as an integrated circuit, which is only depicted diagrammatically in FIG. 1a, is present in the second semiconductor body 20. The receiver device is connected to the ends of the second coil 2 by line connections 41, 42, which are likewise only illustrated diagrammatically. The insulation layer 21 insulates the semiconductor body 20 with the integrated receiver device 40 from the coil 20, so that there is an electrical contact between the coil 20 and the receiver 40 only via the line connections 41, 42.

The realization of the transmitter coil 1 with an aspect ratio, that is to say a ratio of height to width, of greater than 1 reduces the conduction resistance of the transformer configuration and thus increases the winding time constant τ of the primary winding, which is given by τ=L/R, where L is the self-inductance and R is the resistance of the winding.

The realization of the transmitting coil with a large height in comparison with the width of the winding does not enlarge the dimensions of the transformer configurations in the horizontal or lateral direction, since the width W of the windings can remain constant in comparison with conventional windings of this type. In the vertical direction of the configuration there is space available anyway, since there has to be a certain thickness of the configuration in order to ensure a sufficient stability.

Figure 2:
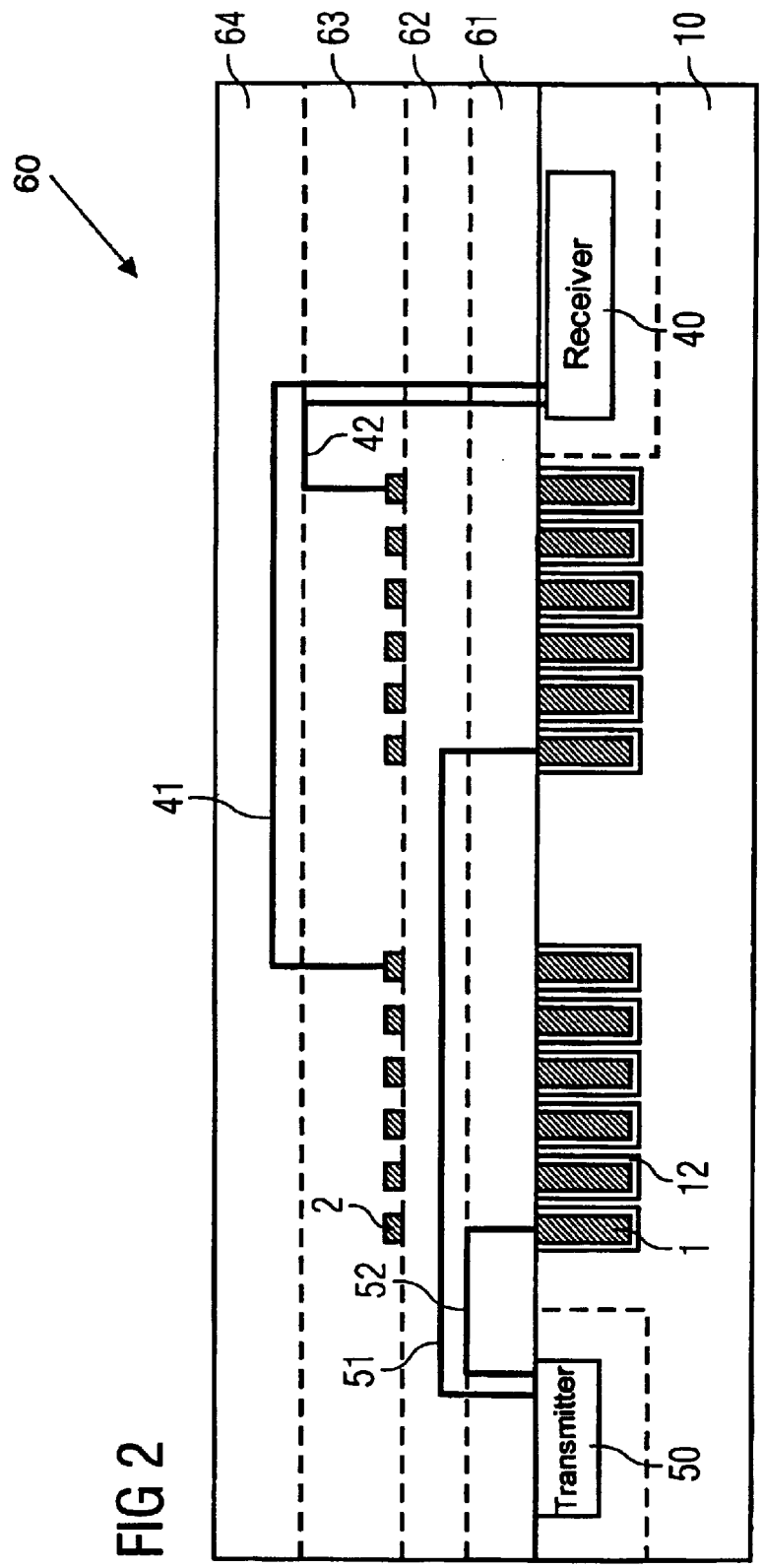
FIG. 2 is a cross sectional view of an exemplary embodiment of an integrated transformer configuration in which the first coil is arranged in a semiconductor body and the second coil is arranged in an insulation layer above the semiconductor body.

FIG. 2 shows a further exemplary embodiment of an integrated transformer configuration. In this exemplary embodiment, the first coil 1 (transmitting coil) is formed in a vertical trench—having a spiral course—of a semiconductor body 10 in the manner already explained in FIG. 1. The first coil 1 is connected to a transmitter 50, integrated in the semiconductor body 10, by means of diagrammatically illustrated line connections 51, 52 formed in a wiring plane above the semiconductor body 10. The wiring plane includes a plurality of layers 61, 62, 63, 64. In the exemplary embodiment, the second coil 2, likewise having a spiral course, is formed in an insulation layer 60 above the semiconductor body 10 and is connected to a receiver device 40, integrated in the semiconductor body 10, by diagrammatically illustrated line connections 41, 42. The insulation layer 60 preferably includes a plurality of layers 61, 62, 63, 64 and is part of a wiring plane or is formed in the manner of a wiring plane. In such a wiring plane, line connections may be arranged in a manner insulated from one another in a plurality of planes in order to electrically interconnect semiconductor components integrated in a semiconductor body or in order to make contact externally with components in the semiconductor body. The second coil 2 may be fabricated in this wiring plane by conventional methods for realizing line connections and is preferably composed of a metal, such as copper or aluminum, for example.

The insulation layer 60, in which the second coil 2 and the line connections 41, 42 and 51, 52, respectively, are accommodated, is composed of a polyimide, for example. The second coil 2 and the line connections 41, 42, 51, 52 are composed of copper or aluminum, for example. In a manner that is not specifically illustrated, electrically conductive connections between the transmitter 50 and the primary coil 1 and between the receiver 40 and the secondary coil 2 may also be formed in the semiconductor body 10.

The first coil 1 is insulated from the semiconductor body 10, and thus from the integrated receiver device 40 and the integrated transmitter device 50, by the insulation layer 12 surrounding the coil. The transmitter 50 and the receiver 40 are preferably surrounded by suitable potential barriers in order to electrically insulate these two devices 40, 50 from one another. These potential barriers are diagrammatically depicted by broken lines in FIG. 2 and include pn junctions, for example, which are sufficiently known in semiconductor technology for the mutual insulation of semiconductor components which are integrated in a common semiconductor body.

A further exemplary embodiment of a transformer configuration according to the invention is illustrated in FIG. 3. In this exemplary embodiment, the first coil 1 and the second coil 2 are arranged in a manner lying one above the other in a trench having a spiral course which extends into the semiconductor body 10 in the vertical direction. In the example, the first coil 1 is situated in the lower part of the trench and is insulated from the semiconductor body 10 by the insulation layer 12. The coil 1 is connected to a transmitter, integrated in the semiconductor body 10, by line connections 51, 52. The transmitter is surrounded by an insulation barrier depicted by broken lines. In the region of the terminals, the first coil 1 extends as far as the surface of the semiconductor body 10 and is contact-connected there by the line connections 51, 52. The second coil is formed such that it is insulated, by the insulation layer 12, from the first coil 1 in the trench and is connected to a receiver device 40, likewise integrated in the semiconductor body 10, by line connections 41, 42. The exemplary embodiment illustrated in FIG. 3 enables a particularly good inductive coupling of the first and second coils 1, 2. Furthermore, this transformer configuration can be realized in a particularly space-saving fashion. As is also the case in the exemplary embodiments explained above, the aspect ratio of the first coil 1 is greater than 1.

FIG. 4 shows a modification of the transformer configuration illustrated in FIG. 3. In the transformer configuration shown in FIG. 4, an SOI substrate is used for the integration of the coils 1, 2, the transmitter 50 and the receiver 40. The SOI substrate has a semiconductor substrate 71 on which a semiconductor layer 72 is applied in a manner insulated by an insulation layer 73. The transmitter 50, the receiver 40 and the coils 1, 2 are integrated in the semiconductor layer 72. The transmitter 50 and the receiver 40 are in each case preferably surrounded by walls 74 made of insulating material, which extend in the vertical direction as far as the insulation layer 73 isolating the semiconductor substrate 71 and the semiconductor layer 72. The insulation walls are fabricated for example by producing trenches around the transmitter and receiver devices 50, 40, formed as integrated circuits, which extend as far as the insulation layer 73 and are subsequently filled with an insulation material.

As in the exemplary embodiments illustrated above, in the exemplary embodiment in accordance with FIG. 4, too, the coil 1 is connected to the transmitter 50 via line connections 51, 52, and the second coil 2 is connected to the receiver 40 by line connections 41, 42.

FIG. 5 shows a further exemplary embodiment of a transformer configuration in which the first coil 1 is formed in a trench having a spiral course which extends into the semiconductor body 10 in the vertical direction. The first coil is connected to a transmitter device 50, which is integrated in the semiconductor body 10, by diagrammatically illustrated line connections 51, 52. The transmitter device is surrounded by a potential barrier depicted by broken lines.

In the exemplary embodiment constructed in accordance with FIG. 5a, the second coil 2 is formed by a heavily doped, for example a heavily n-doped semiconductor region which has a spiral course in the semiconductor body 10 and is formed below the trench with the first coil 1. At ends of this heavily doped semiconductor region, electrically conductive contacts 2A, 2B, for example made of metal, are routed to the surface of the semiconductor body 10, where they are connected to the receiver device, which is likewise integrated in the semiconductor body 10, via line connections 41, 42. The receiver device is surrounded by an insulation barrier depicted by broken lines.

Figure 5B:
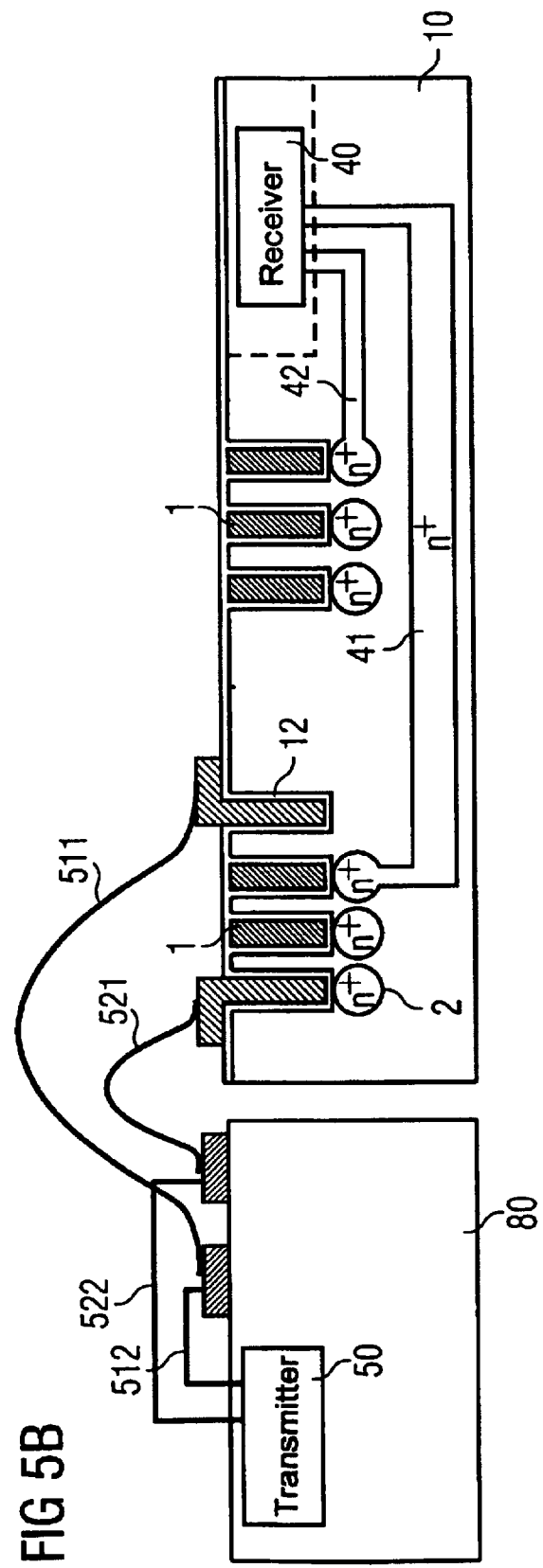
FIG. 5B is a cross sectional view of an exemplary embodiment of an integrated transformer configuration in which the second coil is formed by a heavily doped semiconductor region in a semiconductor body and is connected to a receiver by line connections integrated in the semiconductor body.

FIG. 5b shows a modification of the device according to FIG. 5a, which essentially differs from the device according to FIG. 5a by the fact that the electrically conductive connections 41, 42 between the second coil 2 and the receiver are formed by heavily doped semiconductor zones in the semiconductor body 10 below the trenches of the first coil 1.

Furthermore, in the device in accordance with FIG. 5b, the transmitter device 50 and the receiver device 40 are formed in different semiconductor bodies. In this exemplary embodiment, the receiver device 40 is situated together with the first and second coils 1, 2 in the semiconductor body 10, while the transmitter device 50 is integrated in a further semiconductor body 80 arranged beside the semiconductor body 10 and is connected to the first coil 1, which is the transmitting coil, by line connections 512, 522, 511, 521.

FIG. 6 shows a modification of the transformer configuration illustrated in FIG. 5. The second coil 2 likewise is formed by a heavily doped semiconductor region in this modification. The heavily doped semiconductor region is formed in the region of the surface of the semiconductor body 10 in interspaces of the trench with the first coil 1 and thus runs parallel to the spiral trench and correspondingly likewise is formed in spiral fashion.

Figure 7A:
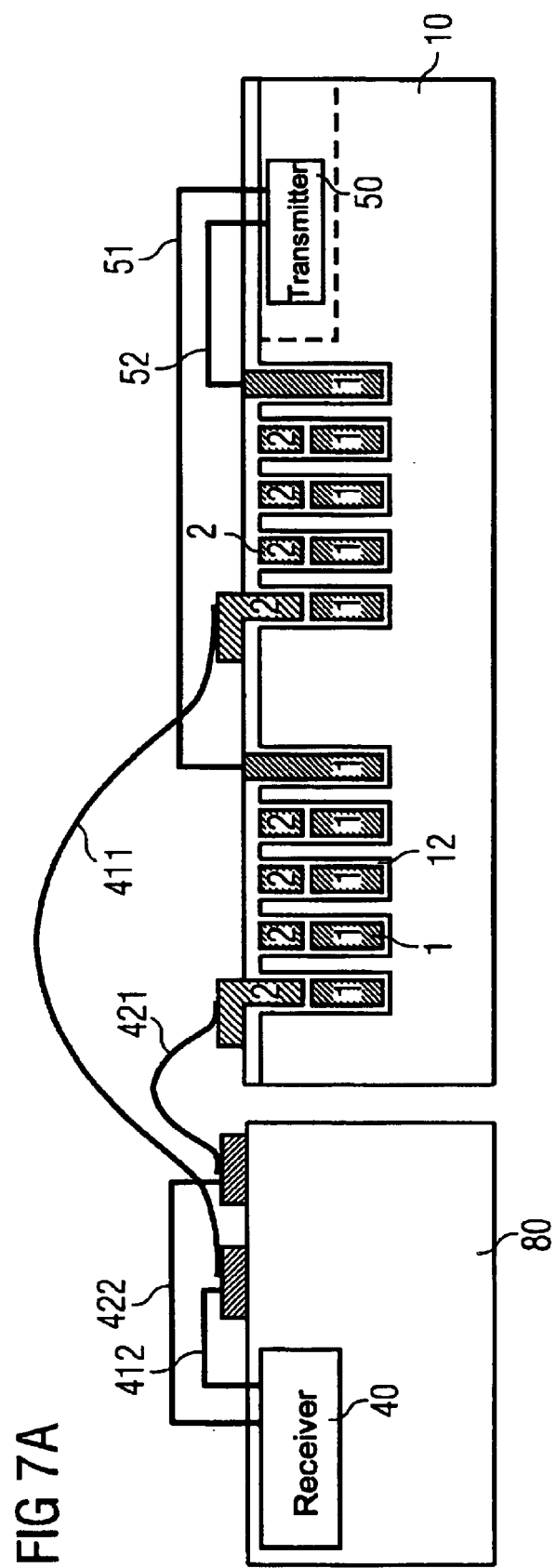
FIG. 7A is a cross sectional view of a further exemplary embodiment of an integrated transformer configuration in which the second coil is formed above the first coil in a manner lying one above the other in a trench of a semiconductor body.

FIG. 7a shows a modification of the transformer configurations which are illustrated in FIGS. 3 and 4 and in which the first and second coils 1, 2 are arranged in a manner lying one above the other in a trench of the semiconductor body 10. In a modification of the exemplary embodiments in accordance with FIGS. 3 and 4, in the exemplary embodiment in accordance with FIG. 7, the transmitting device 50 and the receiver device 40 are not formed in the same semiconductor body. In the example in accordance with FIG. 7, the transmitter 50, surrounded by an insulation barrier depicted by broken lines, is integrated in the same semiconductor body in which the first coil 1 and the second coil 2 are integrated. The receiver 40 is integrated in a further semiconductor body 80 arranged beside the semiconductor body 10. The second coil 2 is connected via line connections 411, 421 to contact terminals of the semiconductor body 80, which in turn are connected to the integrated receiver 40 via line connections 412, 422.

Figure 7B:
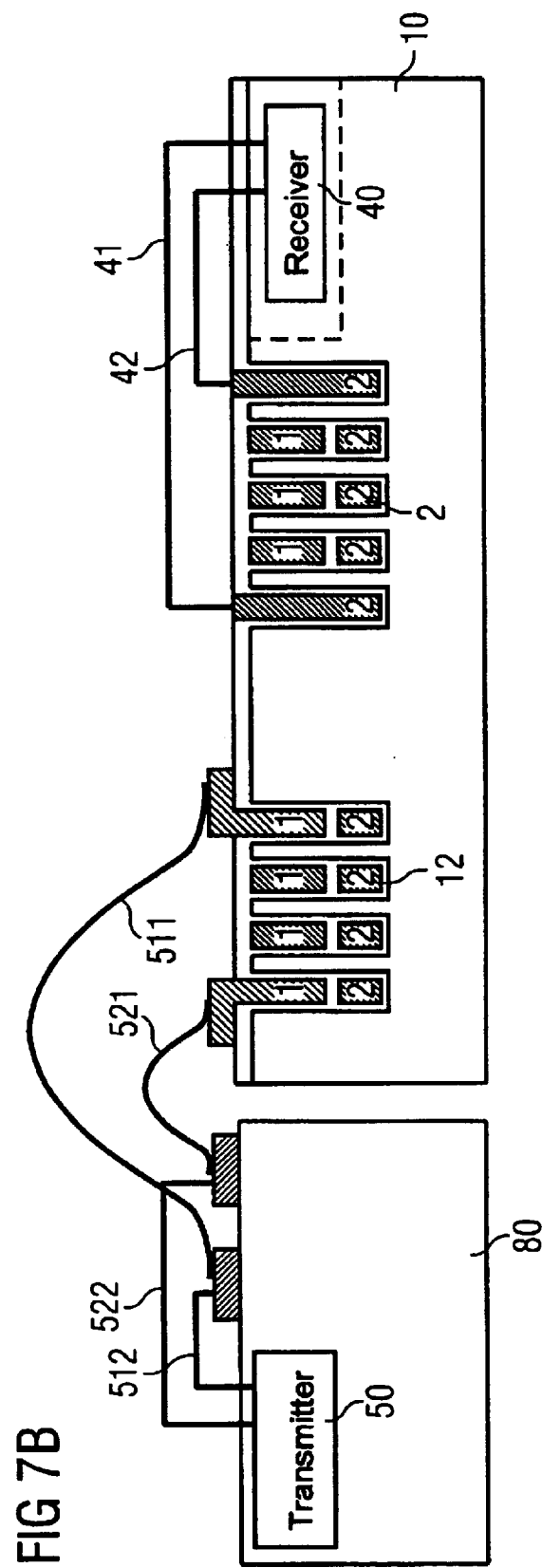
FIG. 7B is a cross sectional view of a further exemplary embodiment of an integrated transformer configuration in which the first coil is formed above the second coil in a manner lying one above the other in a trench of a semiconductor body.

FIG. 7b shows a modification of the transformer configuration illustrated in FIG. 7a, which differs from the transformer configuration illustrated in FIG. 7a essentially by the fact that the second coil 2 is formed in trenches of the semiconductor body 10 below the first coil. The two coils are insulated from one another by the insulation layer 12. The electrically conductive material of the second coil 2 similarly to the construction of the first coil 1 shown in FIG. 7a, extends, at the coil start and at the coil end, as far as the surface of the semiconductor body 10 in order to be contact-connected there by the line connections 41, 42 for connection to the receiver device 41, 42.

In contrast to the transformer configuration in accordance with FIG. 7a, in the configuration in accordance with FIG. 7b, the receiver 40 is integrated in the same semiconductor body 10 as the (transmitting) first coil 1 and the (receiving) second coil 2, while the transmitter device 50 is integrated in the further semiconductor body 80 arranged beside the semiconductor body 10 and is connected to contact terminals of the first coil 1, which is integrated in the semiconductor body 10, by line connections 512, 522, 511, 521.

FIG. 8 shows a further exemplary embodiment of a transformer configuration. In this exemplary embodiment, the transmitter 50 and the receiver 40 are in each case surrounded by a potential barrier depicted by broken lines and are formed as integrated circuits in a semiconductor body 10. Both the first coil 1 and the second coil 2 are accommodated in an insulation layer 60, which is constructed from a plurality of layers 61, 62, 63, 64, above the semiconductor body 10. The insulation layer with the coils 1, 2 is preferably composed of a polyimide. A further insulation layer 14, for example, made of a semiconductor oxide, is applied between the insulation layer 60 and the semiconductor body 10. In the exemplary embodiment, the second coil 2 is applied directly to the insulation layer 14 and is connected to the integrated receiver 40 by line connections 41, 42 formed in the insulation layer 60, which preferably also serves as a wiring layer.

The first coil 1 is arranged above the second coil 2 in a manner insulated by the insulation layer 60 and is connected to the integrated transmitter 50 in the semiconductor body 10 by diagrammatically illustrated line connections 51, 52.

The first coil 1 and the second coil 2 can be realized by means of conventional methods for fabricating interconnects in writing planes above a semiconductor body. The first and second coils 1, 2 are preferably composed of a metal, such as copper or aluminum, for example.

Figure 9:
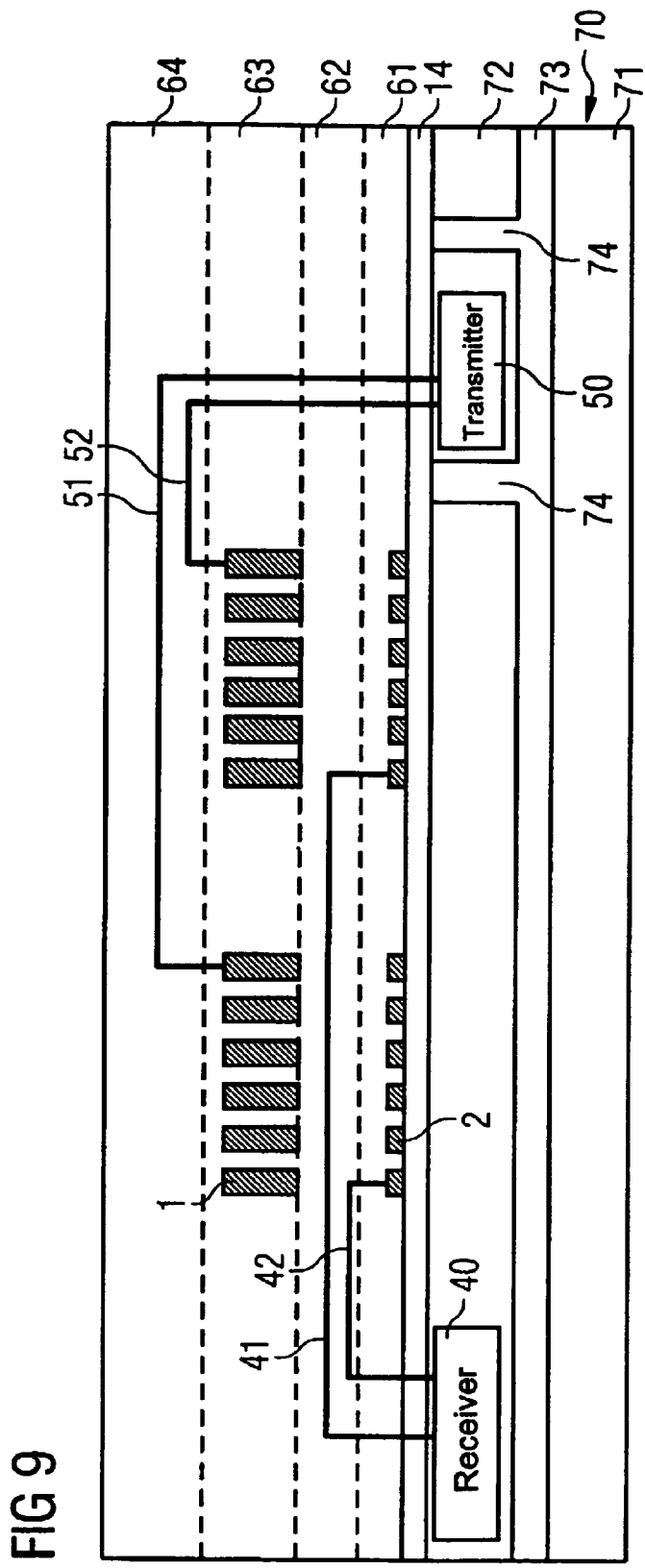
FIG. 9 is a cross sectional view of a further exemplary embodiment of an integrated transformer configuration in which the first and second coils are arranged in an insulation layer above a semiconductor body.

FIG. 9 shows a modification of the exemplary embodiment in accordance with FIG. 8, in which the semiconductor body 70 in which the transmitter and the receiver 40, 50 are integrated is formed by an SOI substrate. This has already been explained in connection with FIG. 4. The transmitter and the receiver 40, 50 are formed in the semiconductor layer 72 above the semiconductor substrate 71. An insulation layer 73 is present between the semiconductor layer 72 and the semiconductor substrate 71. In the example, the transmitter 50 is completely surrounded by electrically insulating walls 74 extending from the surface of the semiconductor layer 72 as far as the insulation layer 73 in order thereby to electrically insulate the transmitter 50 from the receiver 40.

Figure 10:
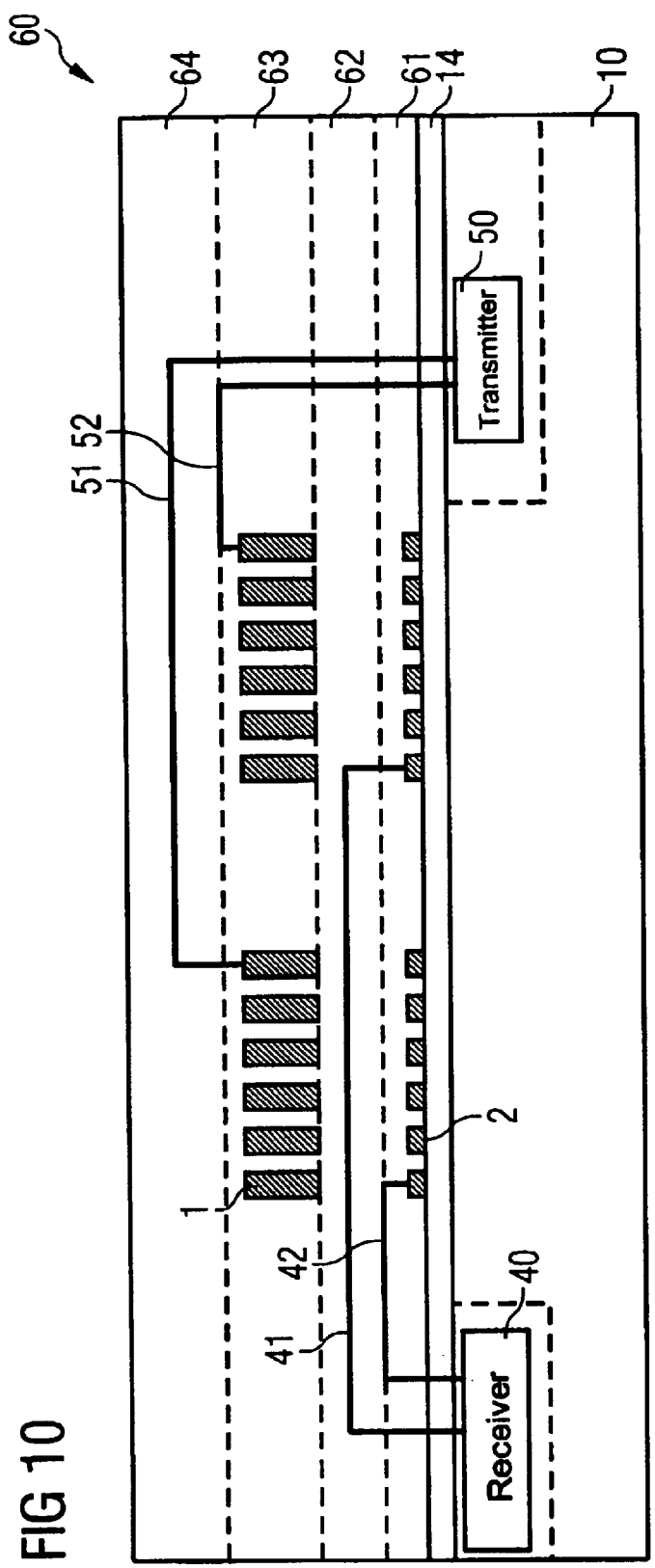
FIG. 10 is a cross sectional view of an exemplary embodiment of an integrated transformer configuration in which the first coil is arranged in an insulation layer above a semiconductor body and the second coil is arranged in the semiconductor body.

FIG. 10 shows a modification of the exemplary embodiment illustrated in FIG. 9, in which the second coil 2 is integrated in the semiconductor body 10 and is preferably formed with a spiral course as a heavily doped semiconductor layer in the region of the surface of the semiconductor body 10. These heavily doped regions are connected to the integrated receiver 40 by line connections 41, 42. The transmitter 50 and the receiver 40 are surrounded by potential barriers depicted by broken lines in order to be electrically insulated from one another and from the second coil 2. The first coil is situated above the second coil in the insulation layer 60 in the manner explained.

Figure 11:
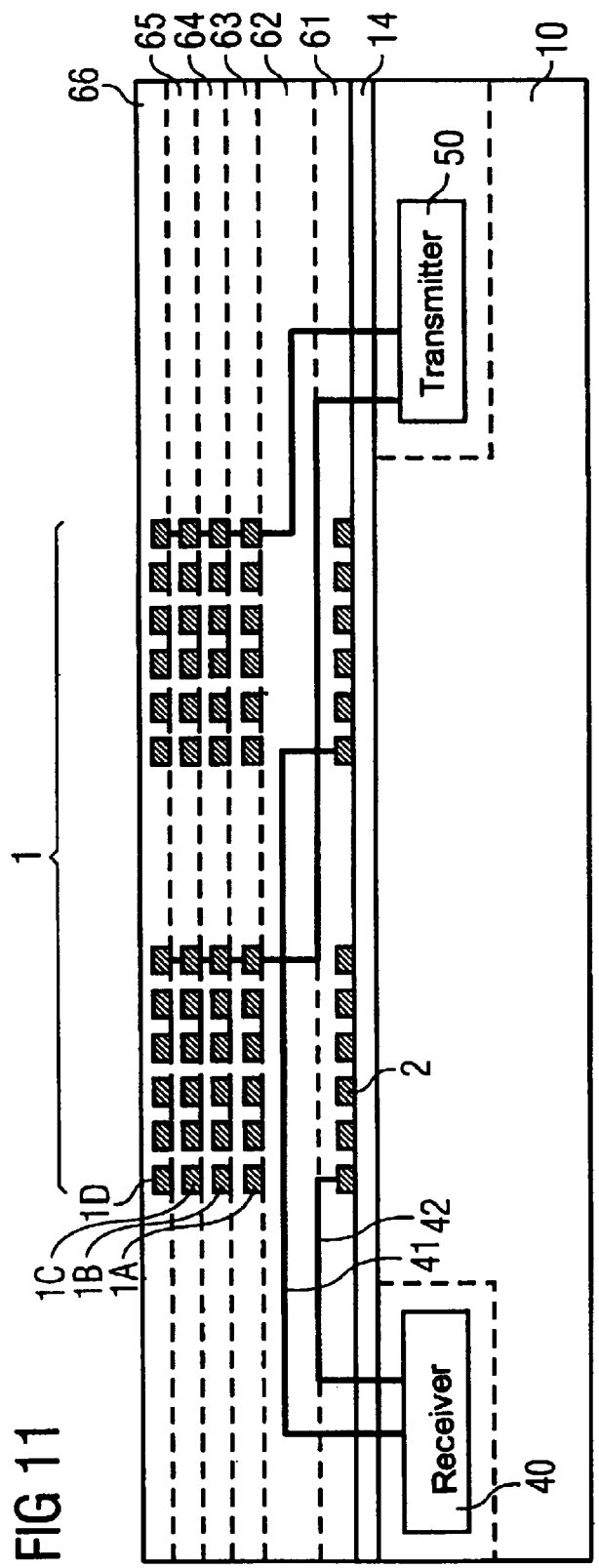
FIG. 11 is a cross sectional view of an exemplary embodiment of an integrated transformer configuration in which the first coil is formed from a plurality of component coils and is arranged in an insulation layer above a semiconductor body.

FIG. 11 shows a further modification of the exemplary embodiment of the transformer configuration explained in FIG. 8. In the exemplary embodiment, the first coil 1 is formed from a plurality of component coils 1A, 1B, 1C, 1D which are arranged parallel to one another and, in comparison with the distance between the first coil 1 and the second coil 2, are at a small distance from one another in the vertical direction and are preferably composed of a metal, such as copper or aluminum, for example. These component coils 1A, 1B, 1C, 1D are jointly connected to the transmitter 50 via line connections 51, 52 and are thus connected in parallel. The height of the turn of the first coil 1 results from the sum of the turns of the component coils 1A, 1B, 1C, 1D. The ratio of the sum of these individual heights of the component turns 1A–1D in relation to the width W of the turns is greater than 1 in order to achieve a large winding time constant.

Figure 12:
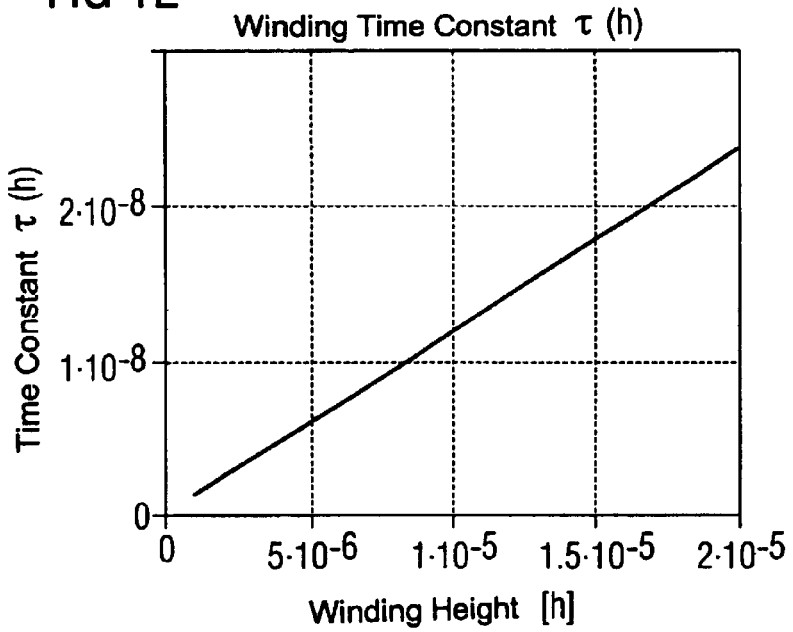
FIG. 12 is a cross sectional view of a diagram showing the profile of the winding time constant as a function of the winding height.

FIG. 12 illustrates, in a diagram, the profile of the winding time constant $\tau(h)$ as a function of the winding height h. This diagram has been determined for a transformer in which the transmitter and the receiver coils each have 10 turns, in which the distance between the transmitting coil and the receiver coil is 10 $\mu$m, and in which the interconnect width W for the transmitting and receiver coil turns is 6 $\mu$m. The lateral distance between the individual turns for transmitting coil and receiver coil is 3 $\mu$m in each case.

As is illustrated in FIG. 12, the winding time constant $\tau$ increases as the winding height h increases. The ratio of winding height h to the winding width is 2.5 given a value of $h=1.5 \cdot 10^{-5}$ for the winding height h.

Figure 13:
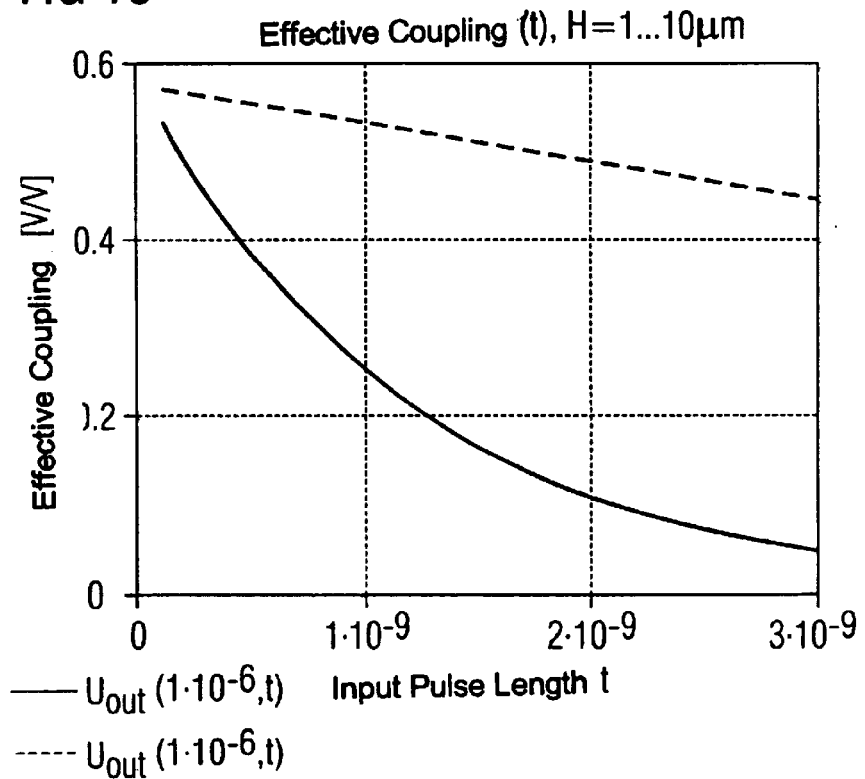
FIG. 13 is a cross sectional view of a diagram of the output voltage of a transformer constructed according to the invention given pulse excitation at the input over time.

FIG. 13 illustrates, in a diagram, the effective coupling of a transformer having the parameters specified above first for a winding height of 1 $\mu$m (solid line), which corresponds to an aspect ratio of 1/6, and for a winding height h of 10 $\mu$m, which corresponds to an aspect ratio of 5/3 (broken line). FIG. 13 shows the profile of a voltage Uout that can be tapped off at the receiver winding given a pulsed excitation at the input. As shown in FIG. 13, the voltage over time t decreases significantly more slowly in the case of the larger aspect ratio than in the case of the smaller aspect ratio, so that a significantly better coupling of the two coils, and hence an improved signal transmission is achieved in the case of a larger aspect ratio.

We claim:

1. An integrated transformer configuration, comprising:
   a first coil formed from an electrically conductive material having a spiral course with an essentially rectangular cross section;
   a second coil having a spiral course;
   a transmitting device connected to one coil selected from a group consisting of said first coil and said second coil; and
   a receiver device connected to another coil selected from a group consisting of said first coil and said second coil;
   said first coil and said second coil being electrically insulated from one another;
   said rectangular cross section of said first coil having a height and a width; and
   a ratio between said height and said width of said rectangular cross section of said first coil being greater than 1.

2. The integrated transformer configuration according to claim 1, wherein said semiconductor body is part of an SOI substrate.

3. The integrated transformer configuration according to claim 1,
   a first semiconductor body formed with a first trench having a spiral course and extending vertically into said semiconductor body, said first coil being formed in said first trench;
   a second semiconductor body, said second coil formed in or on said second semiconductor body, said first semiconductor body and said second semiconductor body configured one above another, said first semiconductor body and said second semiconductor body being insulated from one another;
   said transmitting device integrated in one semiconductor body selected from a group consisting of said first semiconductor body and said second semiconductor body; and
   said receiver device integrated in another semiconductor body selected from a group consisting of said first semiconductor body and said second semiconductor body.

4. The integrated transformer configuration according to claim 1, further comprising:
   a first semiconductor body formed with a first trench having a spiral course and extending vertically into said semiconductor body, said first coil being formed in said first trench, said second coil formed above or below said first coil, said second coil formed in said first trench; and
   said transmitting device and said receiver device integrated in said first semiconductor body.

5. The integrated transformer configuration according to claim 1, further comprising:
   a plurality of semiconductor bodies including a first semiconductor body formed with a first trench having a spiral course and extending vertically into said semiconductor body, said first coil being formed in said first trench, said second coil formed above or below said first coil, said second coil formed in said first trench; and
   said transmitting device and said receiver device integrated in different ones of said plurality of semiconductor bodies; and
   one of said transmitting device and said receiver device being integrated in said first semiconductor body.

6. The integrated transformer configuration according to claim 1, further comprising:
   a semiconductor body; and
   an insulation layer formed above said semiconductor body;
   said first coil formed in said insulation layer.

7. The integrated transformer configuration according to claim 6, further comprising:
   a metalization plane;
   said insulation layer being part of said metalization plane.

8. The integrated transformer configuration according to claim 6, wherein:
said first coil is formed from a plurality of component coils configured one above another in said insulation layer; and
said plurality of component coils are electrically connected to one another.

9. The integrated transformer configuration according to claim 6, wherein:
said second coil is formed above said semiconductor body; and
said second coil is formed in said insulation layer and is insulated from said semiconductor body.

10. The integrated transformer configuration according to claim 9, wherein said second coil is formed between said first coil and said semiconductor body.

11. The integrated transformer configuration according to claim 6, wherein said second coil is formed in said semiconductor body.

12. The integrated transformer configuration according to claim 11, wherein said second coil is formed from a heavily doped semiconductor material.

13. The integrated transformer configuration according to claim 1, wherein said ratio between said height and said width of said rectangular cross section of said first coil is greater than 3.

14. The integrated transformer configuration according to claim 1, further comprising:
a first semiconductor body formed with a first trench having a spiral course and extending vertically into said semiconductor body;
said first coil being formed in said first trench.

15. The integrated transformer configuration according to claim 14, further comprising:
a second semiconductor body;
said second coil formed in or on said second semiconductor body;
said first semiconductor body and said second semiconductor body configured one above another; and
said first semiconductor body and said second semiconductor body being insulated from one another.

16. The integrated transformer configuration according to claim 14, further comprising:
a second semiconductor body; and
an insulation layer formed between said first semiconductor body and said second semiconductor body;
said first semiconductor body and said second semiconductor body configured one above another;
said first semiconductor body and said second semiconductor body being insulated from one another by said insulation layer; and
said second coil formed in said insulation layer.

17. The integrated transformer configuration according to claim 14, wherein:
said second coil is formed above or below said first coil; and
said second coil is formed in said first trench.

18. The integrated transformer configuration according to claim 14, further comprising:
an insulation layer formed above said first semiconductor body;
said second coil formed in said insulation layer.

19. The integrated transformer configuration according to claim 18, further comprising:
a metalization plane;
said insulation layer being part of said metalization plane.

20. The integrated transformer configuration according to claim 14, wherein said first semiconductor body includes a heavily doped semiconductor material forming said second coil.

21. The integrated transformer configuration according to claim 20, wherein said heavily doped semiconductor material forming said second coil is formed below said first trench with said first coil.

22. The integrated transformer configuration according to claim 20, wherein said heavily doped semiconductor material forming said second coil is formed adjacent said first trench with said first coil.

23. An integrated transformer configuration, comprising:
a first coil formed from an electrically conductive material having a spiral course with an essentially rectangular cross section;
a second coil having a spiral course;
a first semiconductor body formed with a first trench having a spiral course and extending vertically into said semiconductor body, said first semiconductor body having a heavily doped semiconductor material forming said second coil;
said first coil formed in said first trench;
said first coil and said second coil being electrically insulated from one another;
said rectangular cross section of said first coil having a height and a width; and
a ratio between said height and said width of said rectangular cross section of said first coil being greater than 1.

24. The integrated transformer configuration according to claim 23, wherein said heavily doped semiconductor material forming said second coil is formed below said first trench with said first coil.

25. The integrated transformer configuration according to claim 23, wherein said heavily doped semiconductor material forming said second coil is formed adjacent said first trench with said first coil.

26. An integrated transformer configuration, comprising:
a first coil formed from an electrically conductive material having a spiral course with an essentially rectangular cross section;
a second coil having a spiral course;
a first semiconductor body formed with a first trench having a spiral course and extending vertically into said semiconductor body;
said first coil being formed in said first trench;
said second coil being formed above or below said first coil;
said second coil being formed in said first trench;
said first coil and said second coil being electrically insulated from one another;
said rectangular cross section of said first coil having a height and a width; and
a ratio between said height and said width of said rectangular cross section of said first coil being greater than 1.

27. An integrated transformer configuration, comprising:
a first coil formed from an electrically conductive material having a spiral course with an essentially rectangular cross section;

a second coil having a spiral course;

a semiconductor body;

an insulation layer formed above said semiconductor body;

said first coil formed in said insulation layer;

said first coil and said second coil being electrically insulated from one another;

said rectangular cross section of said first coil having a height and a width;

a ratio between said height and said width of said rectangular cross section of said first coil being greater than 1;

said first coil is formed from a plurality of component coils configured one above another in said insulation layer; and said plurality of component coils are electrically connected to one another.

* * * * *